United States Patent [19]
Einziger et al.

[11] Patent Number: 6,038,867
[45] Date of Patent: Mar. 21, 2000

[54] WIDE MULTILAYER INSULATING BLANKETS FOR ZERO BOILOFF SUPERCONDUCTING MAGNET

[75] Inventors: William Louis Einziger; Phillip William Eckels; Michael Loren Creel, all of Florence, S.C.

[73] Assignee: General Electric Company, Milwaukee, Wis.

[21] Appl. No.: 09/127,499

[22] Filed: Jul. 31, 1998

[51] Int. Cl.[7] ........................................ F17C 1/00
[52] U.S. Cl. ............................ 62/45.1; 505/892
[58] Field of Search .................... 62/45.1, 51.1; 505/892

[56] References Cited

U.S. PATENT DOCUMENTS

| | | | |
|---|---|---|---|
| 3,130,561 | 4/1964 | Hnilicka, Jr. | 62/45.1 |
| 3,139,206 | 6/1964 | Matsch | 62/45.1 |
| 3,855,811 | 12/1974 | Sauerbrunn et al. | 62/45.1 |
| 3,993,213 | 11/1976 | Burge et al. | 62/45.1 |

*Primary Examiner*—Ronald Capossela
*Attorney, Agent, or Firm*—Iry Freedman; Christian G. Cabou; Phyllis Y. Price

[57] ABSTRACT

A thermally insulating joint for multilayer insulating blankets for a superconducting magnet with layers of low thermal emissivity material separated by low conductivity spacers staked together with adjacent joints and vents offset from each other and with low emissivity adhesive strips overlying the remote ends of adjacent layers of the joined blankets.

14 Claims, 3 Drawing Sheets

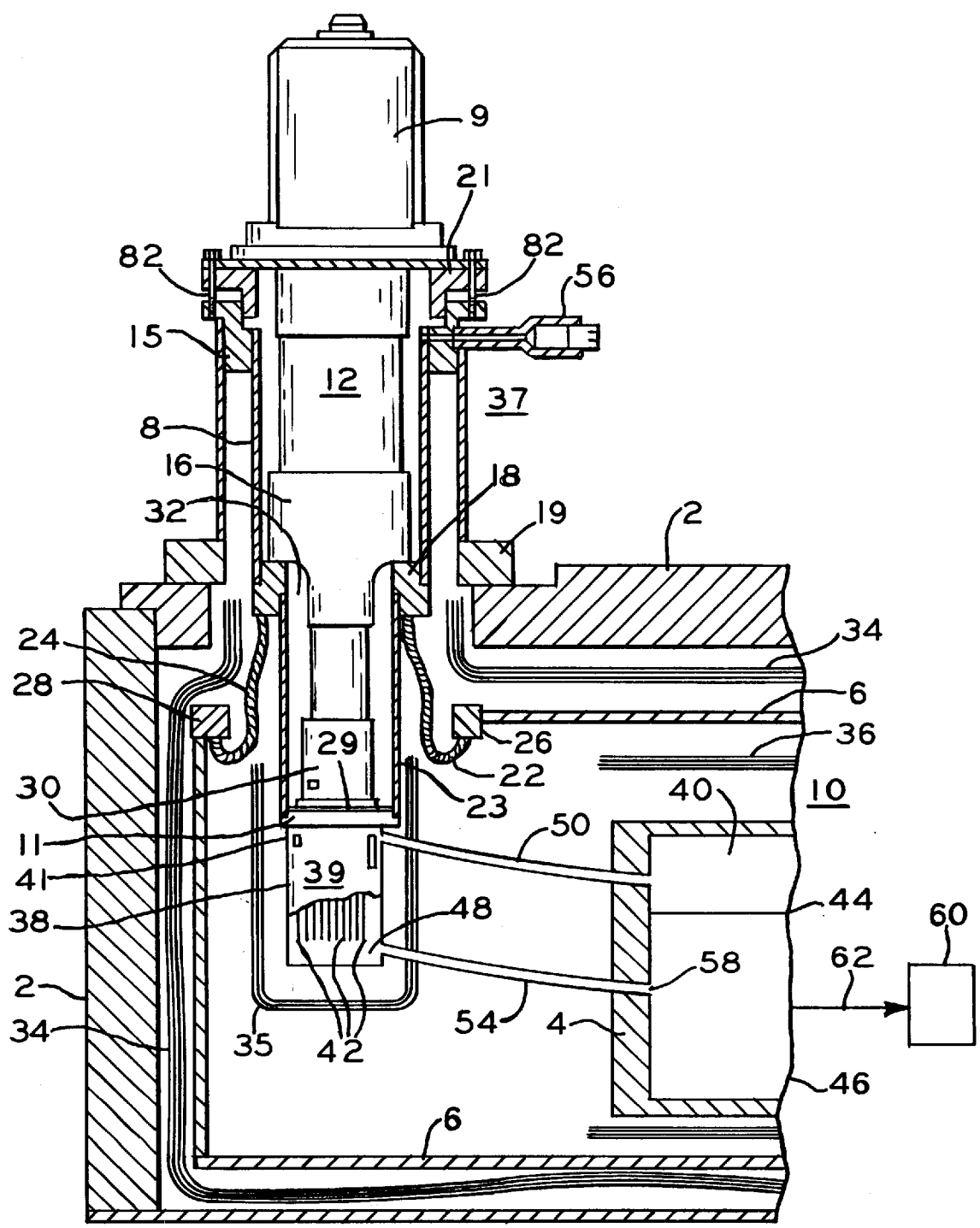
FIG_1

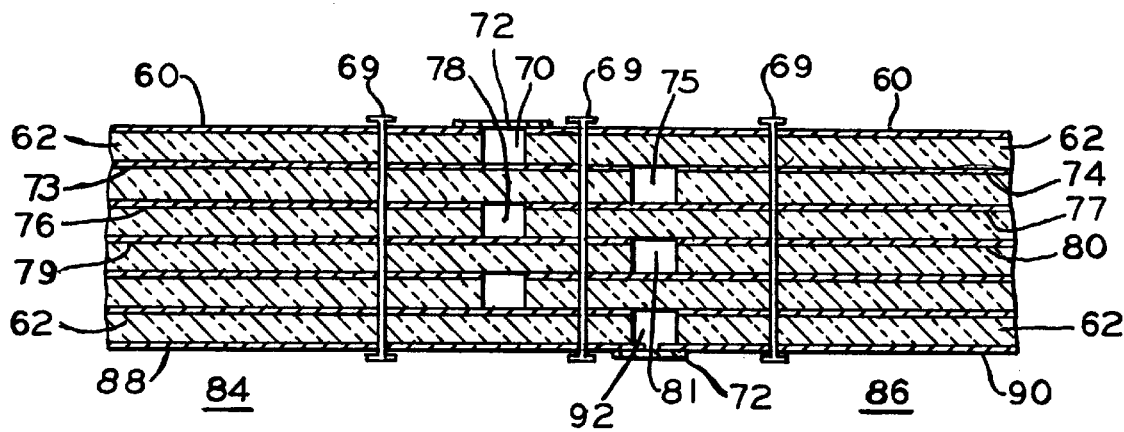
FIG_2
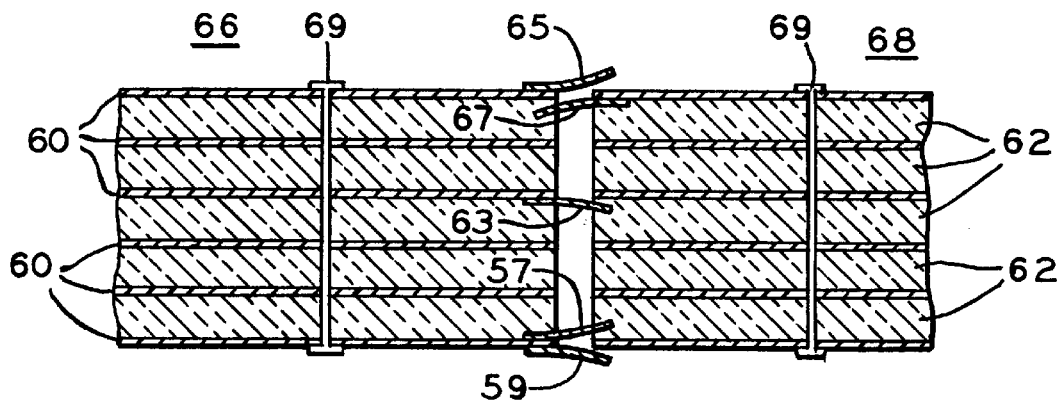
FIG_3
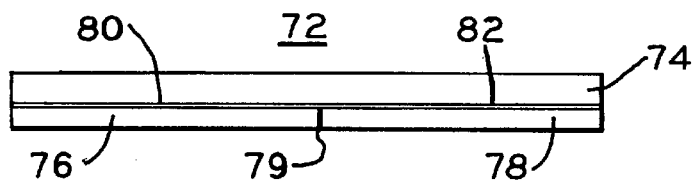
FIG_4

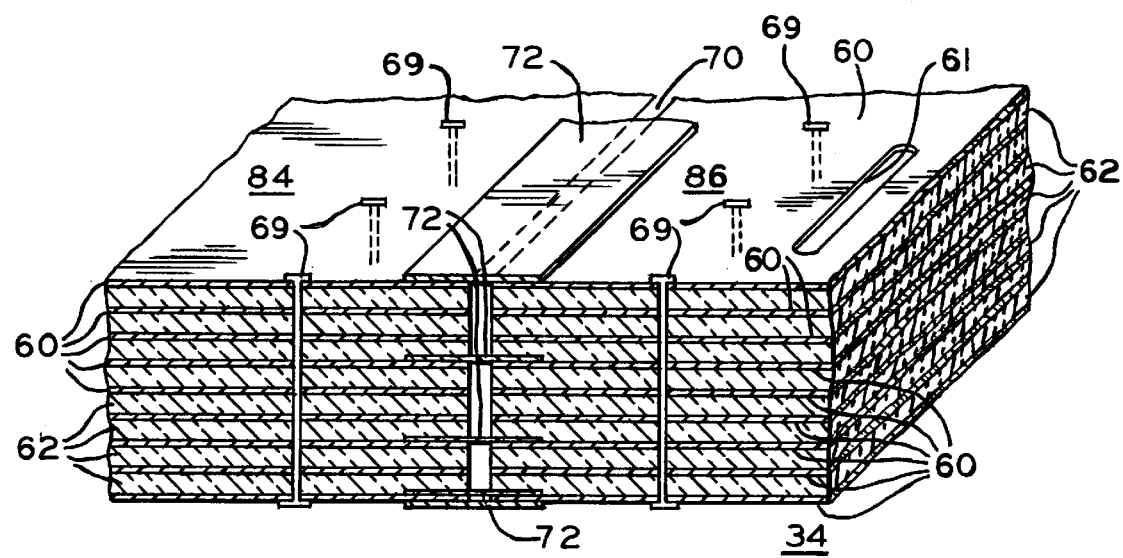
FIG_5
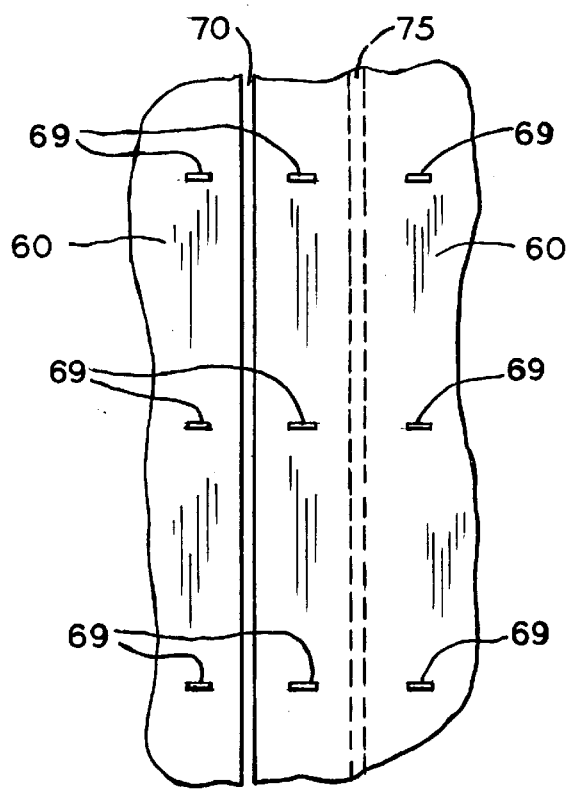
FIG_6

WIDE MULTILAYER INSULATING BLANKETS FOR ZERO BOILOFF SUPERCONDUCTING MAGNET

BACKGROUND OF THE INVENTION

This invention relates to thermally efficient insulating blankets for helium cooled superconducting magnet assemblies for magnetic resonance imaging (hereinafter called "MRI"), and more particularly to an improved multilayer wide blanket suitable for MRI systems utilizing a recondenser for recondensing the resultant helium gas back into liquid helium.

As is well known, a superconducting magnet can be made superconducting by placing it in an extremely cold environment, such as by enclosing it in a cryostat or pressure vessel containing a cryogen such as liquid helium. The extreme cold provided by the boiling helium maintains current flow through the magnet coils after a power source initially connected to the coil (for a relatively short period) is disconnected due to the absence of electrical resistance in the cold magnet coils, thereby maintaining a strong magnetic field. Superconducting magnet assemblies find wide application in the field of MRI.

The provision of a steady supply of liquid helium to MRI installations all over the world has proved to be difficult and costly leading to considerable research and development effort directed at minimizing the need to replenish the boiling liquid helium such as by recondensing and recycling the resultant helium gas. Also, it is desirable to avoid the difficulties encountered in storing the necessary reserve supply of liquid helium at cryogenic temperatures of around 4 K (or close to absolute zero) and the related problems of periodically transferring a portion of the liquid helium in the storage reservoir to the liquid helium supply in the MRI superconducting magnet.

In a typical MRI magnet, the main superconducting magnet coils are enclosed in a cylindrically shaped cryogen pressure vessel defining an imaging bore in the central region along its axis. A vacuum vessel surrounds the pressure vessel and a mechanical cryocooler in the space between the two vessels provides cooling to recondense the helium gas resulting from the boiling back to liquid helium for reintroduction and reuse in the helium vessel.

Superconducting magnets which recondense the helium gas back to liquid helium are often referred to as zero boiloff (ZBO) magnets. In such ZBO magnets, insulation is provided between the vacuum and helium pressure vessels and also around the recondenser between the recondenser and the pressure vessel to minimize heat loss. High efficiency insulation is very important in such ZBO systems since the mechanical cryocooler is often taxed to its cooling capabilities and heat losses can preclude proper or efficient operation of such systems. In addition, such insulation should provide at the same time a thermally efficient way for the escape of trapped air or gasses in the blanket during evacuation of the superconducting magnet.

MRI superconducting magnets are necessarily quite large to accommodate patients in the bore leading to the requirement for wide blankets to, for example, surround the pressure vessel which typically can have an outer diameter of 2 meters and a length of 2 meters. Sufficiently wide thermal insulating blankets are cumbersome to handle and difficult to manufacture.

However, highly reflective, very thin single or double side aluminized plastic film is commercially available in widths of only up to 60 inches. For use in MRI superconducting magnets, the width of multilayer insulating blankets required is frequently more than the 60 inches available, often as much as 80–100 inches wide. Moreover, the blankets have proven difficult to join without unacceptable heat loss at the joint between the multilayer insulating blankets. In addition, while thermal insulation and shielding is required of such blankets, it is also important to provide a path for the escape or evacuation of any trapped air or gasses in the insulating spacer layers interposed between the aluminized film layers.

Attempts to avoid unacceptable heat loss at joints have included spiral winding of blankets around cylindrical components such as the radiation shield in the magnet or configurations with interposed edges of adjacent reflective films resulting in a double thickness blanket at the overlapped seams.

Increased thickness of the multilayer blankets is disadvantageous in superconducting MRI magnets, especially in the warm patient bore, because the double thickness must be accommodated without MLI compression in a place where space is at a premium. If one-half inch of radius can be saved in the warm bore, the resulting smaller diameter superconducting coils use less superconducting wire, saving up to 4,000 feet of superconducting wire.

SUMMARY OF INVENTION

Thus, there is a particular need for improved thermal insulating blankets of adequate width for use in ZBO superconducting magnets yet which provide improved thermal insulation and an entrapped gas escape path, and which are readily capable of manufacture and installation; and a further need to provide a joint for the abutted remote ends of blankets in which heat leakage through the joint is minimized.

In accordance with one form of the invention wide thermally insulating blankets are provided by the joining of multilayer blankets each including aluminized sheets separated by insulating layers. Alternating pairs of sheets and layers are offset from each other and a plurality of T-shaped thermally low or minimally conductive stakes prevent the layers from relative movement while minimizing heat transfer through the blankets. The joining of the blankets to provide wider blankets provides offset alternate joints and vent slits between adjacent aluminized layers. This minimizes heat loss while allowing the evacuation of residual gas in the insulating layers during evacuation of the vacuum vessel of the superconducting magnet. The remote ends of the joined blanket are provided with self adhesive aluminized strips having peel off backings for securing the remote ends to form an additional joint when the blankets are positioned around a member such as the cryogen pressure vessel of the superconducting magnet. Aluminized strips are applied to some adjacent sheets of aluminized layers of the abutting ends of the joined blankets.

DESCRIPTION OF DRAWINGS AND INVENTION

FIG. 1 is a partial cross-section of a portion of a MRI superconducting magnet shown in simplified form incorporating the present invention.

FIG. 2 is an enlarged portion of an insulating blanket of FIG. 1 showing details of the blanket seams between joined blankets.

FIG. 3 is an enlarged simplified view of the seam of the insulating blanket of FIG. 1 illustrating the means for securing multiple joints between adjacent reflective sheets of blankets to secure the remote ends of the blankets.

FIG. 4 is an enlarged view of a portion of FIG. 3.

FIG. 5 is a perspective view of a simplified showing of FIG. 3.

FIG. 6 is an enlarged top view of a portion of FIG. 2.

Referring first to FIG. 1, MRI superconducting magnet system 10 includes helium pressure vessel 4 including a liquid cryogen such as helium 46 and surrounded by vacuum vessel 2 with thermally isolating radiation shield 6 interposed between the helium vessel and the vacuum vessel. A cryocooler 12 (which may be a Gifford-Mahon cryocooler) extends through vacuum vessel 2 within sleeve 8, 18, 23 such that the cold end of the cryocooler may be selectively positioned within the sleeve without destroying the vacuum within the vacuum vessel 2, and heat generated by motor 9 of the cryocooler is outside the vacuum vessel. Cryocooler 12 is installed in the cryocooler sleeve assembly 8, 18, 23 with matching transition flange 21 and secured with bolts 82 and associated washers (not shown).

First stage heat station 16 of cryocooler 12 contacts copper first stage thermal sleeve or heat sink 18 which is thermally connected through braided copper flexible thermal couplings 22 and 24 and copper thermal blocks 26 and 28 on isolating radiation shield 6 to cool the radiation shield to a temperature of approximately 60K providing active thermal isolation between helium vessel 4 and vacuum vessel 2.

The bottom surface of second stage heat station 30 of cryocooler 12 contacts indium gasket 29 to efficiently provide a temperature of 4 K to heat sink 11 positioned on the opposite side of the indium gasket.

Extending below, and thermally connected to, heat sink 11 is helium recondensing chamber 38, made of high thermal conductivity material such as copper, which includes a plurality of substantially parallel heat transfer plates or surfaces 42 in thermal contact with heat sink 11 and forming passages between the surfaces of the plates for helium gas flow from helium pressure vessel 4.

Helium gas 40 forms above liquid helium surface level 44 of liquid helium supply 46 through the boiling of the liquid helium in providing cryogenic temperatures to MRI magnet system 10. Helium gas 40 passes through helium gas passage 50 to the interior of the upper portion 41 of helium recondensing chamber or canister 38. Cooled helium gas 40 passing between the cooled heat transfer plates 40 recondenses into liquid helium to collect in bottom region 48 of helium recondensing chamber 38. The recondensed liquid helium then flows by gravity through helium return line 54 back to liquid helium supply 46, it being noted that helium recondensing chamber 38 is positioned higher than liquid helium passageway 58 in helium vessel 4.

As a result, during operation of MRI magnet system 10 liquid helium 46 cools superconducting magnet coil assembly (shown generally as 60) to a superconducting temperature with the cooling indicating generally by arrow 62 in the manner well known in the MRI art, resulting in boiling of helium liquid 46 and production of helium gas 40 above helium surface level 44. However, helium gas 40 instead of being vented to the surrounding atmosphere 37 as is common in many MRI equipments is recondensed back to liquid helium and returned to liquid helium supply 46 as liquid helium in the manner described.

Multilayer thermal insulation blankets 34 and 36 are provided in the space between radiation shield 6 and vacuum vessel 2 and in the space between the radiation shield and helium vessel 4 to further thermally isolate helium vessel 4 from vacuum vessel 2. Insulation blanket 35 is provided between recondensing chamber 38 and helium vessel 4 to thermally isolate the recondensing chamber 38, particularly during removal and servicing of cryocooler 12 which warms up cryocooler sleeve 13. Superinsulation 34 and 36 are wide aluminized multi-layer insulation blankets as described below.

Referring next to FIG. 2, thermal insulation blankets 84 and 86 include a plurality of sheets or layers (20 or more) of low emissivity 25 gauge thin aluminized mylar or aluminum thermally reflective sheets such as 60, 73, 74, 76, 77, 79, 80, 88 and 90 separated by low conductivity material spacer sheets such as 62 of spun-bonded polyester which is not bonded to the aluminized mylar or aluminum sheets potentially enabling their separate and relative motion. However, they are held together by the plurality of stakes 69 of nonconductive material such as Nylon to prevent such relative motion of the layers during handling. Stakes 69 may be similar to the "T" bar stakes used in the clothing industry. Other methods of holding the blanket together to prevent slipping or movement of the layers 60 and 62 during handling and installation include sewing with PET (polyethyleneterpenthalate) thread and ultrasonic welding.

In order to obtain the required additional blanket width of particular installation requirements for MRI applications blankets 84 and 86 joined together as described below.

It is to be noted that adjacent top layer reflective sheets 60 meet at joint 70. However, the next lower layer of adjacent reflective sheets 73 and 74 and the separating low conductivity spacer sheets 71 are offset such that joint 75 is offset from joint 70. Similarly the next lower layer of reflective sheets 76 and 77 meet at joint 78 which is offset from joint 75 and in line with joint 70. The remainder of the joints of succeeding layers of reflective sheets such as 79 and 80 meet at joints such as 81 with the successive joints of the reflective sheets forming the insulating blankets interleaved and overlapping in an offset arrangement in which the joints of adjacent reflective sheets are not positioned adjacent to each other and are non-overlapping. This offset is shown by way of an enlarged top view in FIG. 6 in which it is seen that successive joints 70 and 75 are offset 6–12 inches to preclude heat leakage through adjacent or successive joints. With such an arrangement, it is possible to stake blankets 84 and 86 with T-bar stakes 69 in rows outside joint 70, 75, 78 and 81 (as shown in FIG. 2) to form an increased width blanket which does not have joints of increased thickness or additional heat leak. However, additional strength and thermal insulation can be obtained by the use of heat reflective tape tab 72 of thin mylar or aluminized sheet overlying at least the outer or outside joints 70 and 92 (see FIG. 2) where the tape tabs bridge reflective sheets 60 and 60; and 88 and 90 respectively.

As shown in FIG. 5, one or more venting slits or apertures 61 in reflective sheets 60 extend substantially parallel to joint 70 to allow the escape or evacuation of any residual air or gas trapped within spacer sheets 62 when vacuum vessel 2 (see FIG. 1) is evacuated prior to commencing superconducting operation of superconduting magnet system 10. Similar ventilation slits 61 are provided in reflective sheets such as 73, 74; 76, 77; 79, 80; and 88, 80 (see FIG. 2) such that the offsetting of the successive reflective sheets offsets the ventilation slits in the same manner as joints such as 70 and 75 are offset. This provides a tortuous indirect path for the escape of entrapped gas but avoids a direct thermal opening through multilayer blankets 84 and 86. Gas may also escape through the joints such as 70 and 75 between adjacent layers of blankets 84 an 86, it being appreciated that the openings are shown oversized in the Figures for purposes of explanation.

After blankets 84 and 86 are joined together to form a wider blanket for a particular installation, and the combined blankets wrapped around the appropriate superconducting magnet 10 components (such as shown by blankets 34 and 36 in FIG. 1 to surround thermal shield 6 and pressure vessel 10) their remote ends are joined by the butt joint and tape tabs as shown by FIGS. 3, 4 and 5.

FIGS. 3, 4 and 5 show the joint at remote ends of multi-layer insulating blankets 84 and 86. Referring to FIGS. 3, 4 and 5, blankets 84 and 86 are butted together as closely as possible with joint or seam 70 spacing being exaggerated in FIGS. 3 and 5. A plurality of adjoining ends of low emissivity reflective aluminized sheets (all of which are indicated as 60 in FIG. 5) are joined together by overlapping tape tabs or strips 72 which extend over the seam region of adjacent reflective sheets 60. It is to be noted that a plurality, but only some, of adjacent sheets 60 are secured together in FIG. 5 by strips 72. It may be desirable for some installations to join most or even every adjacent pair of aluminized reflective sheets 60 with tape tabs 72 in order to form an enclosure with seams that will be most effective in minimizing heat transfer from vacuum vessel 2 to radiation shield 6 (see FIG. 1).

As best shown in FIG. 5, tape tab 72 includes a suitable adhesive 80, 82 on one side of double aluminized mylar tape 74 protected by peel-off backing 76, 78 which extends from center 79 of the adhesive 80, 82 side of the tab to the edges of the tape to enable selective removal of the tabs. This enables one half of the peel-off backing to be removed or exposed, exposing adhesive 80 for application to aluminized sheets 60 of multilayer blanket 84 after which the remainder of peel-off backings 78 are sequentially removed to expose the rest of adhesive 82 in order to secure tap or strip 74 to the adjacent aluminized sheets of blanket 86. Tabs 72 can be provided on any number of aluminized sheets 60 to ensure the required degree of thermal insulation and blanket structural integrity. Blankets such as 84 with pre-installed tape tabs 72 over one or more remote edges will greatly increase the speed and ease in which adjacent blankets such as 86 can be joined and installed to provide a low heat leak seal. This is particularly applicable for joining the remote ends of multi-layer blankets already joined as described above in regard to FIG. 2 and where the remote joint is accomplished after the multilayer blankets are installed in magnet system 10 such as insulating blankets 34 and 36 of FIG. 1.

Multilayer insulation blankets such as 84 and 86 joined as described above provide effective insulation against heat leak between two surfaces at different temperatures such as radiation shield 6 or pressure vessel 4 and vacuum vessel 2 (see FIG. 1) and also provide escape paths for any entrapped gas in the insulating blankets during evacuation of the vacuum vessel and the rendering of superconducting magnet 10 superconducting. Such multilayer insulation is extremely efficient at intercepting heat when used in a high vacuum environment ($<=1\times10^{-4}$ Torr). It is accordingly extremely important in cryogenic applications such as MRI superconducting magnet 10 where the capacity of cryocooler 12 may be taxed to its limit in its enabling proper recondensing of helium gas back to liquid helium for reuse in the superconducting magnet. Each low emissivity layer 60 acts as an uncooled radiation shield, the efficiency of which is proportional to the surface emissivity. Low conductivity spacer 62 minimizes contact between adjacent layers. Since each layer effectively operates at a different temperature this minimizes conduction heat transfer. The high vacuum within vacuum vessel 2 minimizes conduction of heat through any residual gas between layers 60 and tape tab 72 effectively closes the seam between blankets 84 and 86 since even very small seams or cracks can cause heat leakage which can easily surpass the total heat transferred through the main blanket surface area if such cracks or seams are not properly closed. Self-adhesive tab 72 provides effective closure for superconducting magnet thermal insulation blankets without the tedious and time consuming task presently encountered with present closing arrangements, particularly when seaming is accomplished during superconducting magnet 10 assembly or installation. Tape tabs 72 are approximately two inches wide and stakes 69 are positioned approximately 12 inches apart to provide room to manipulate and join adjacent sheets 60.

FIG. 5 illustrates the use of a plurality of aluminized tape tabs 72 with the tape tabs overlying a single surface of adjacent aluminized sheet 60 while FIG. 3 illustrates different positioning of the tape tabs relative to adjacent aluminized sheets. Referring to FIG. 3, it is to be noted that tape tab 63 is positioned on the bottom surface of adjacent aluminized reflective sheets 60 while tape tabs 65 and 67 overly both the top and bottom surfaces of adjacent reflective sheets 60. Tape tabs 57 and 59, similar to tape tabs 65 and 67, overly both the top and bottom of adjacent reflective sheets 60. However, both of tabs 75 and 59 are shown as initially secured to blanket end 66 to be subsequently secured to adjacent blanket end 68, while in the case of tape tabs 65 and 67 tape tab 65 is initially secured to blanket end 66 while tape tab 67 is initially secured to blanket end 68 to provide a finished joint 57, 59 which is essentially the same as finished joint 65, 67. The initial securing of a tape tab can thus be on either insulating blanket end to be joined or some tape tabs initially on both insulating blankets. Since the alternating reflective layers 60 and insulating layers 62 are not bonded together, they are free to be moved and separated in the region between stakes 69. As a result when, for example, it is desired to utilize an intermediate tape tab 72, the reflective and insulating layers 60, 62, above the tab being secured can be readily pushed aside during the securing of the tape tab to the adjacent reflective layer. For ease of illustration, the initial positions of tape tabs 72 relative to the reflective layers 60 to which they are secured are shown in FIG. 3 without pushing adjacent layers aside.

The present invention thus provides insulating blankets wider than those commercially manufactured and available and which are suitable for use in superconducting magnets which require such wider blankets, and in particular in zero boiloff magnets which are very sensitive to residual heat leak and in which the recondensing system may be incapable of practical or efficient operation in the presence of heat leaks. The present invention provides a quick, inexpensive and simple arrangement to thermally seal multilayer blanket seams efficiently while at the same time providing an entrapped gas escape path.

While the present invention has been described with respect to certain preferred embodiments thereof, it is to be understood that numerous variations in the details of construction, the arrangement and combination of parts, and the types of materials used may be made without departing from the spirit and scope of the invention.

What is claimed is:

1. For use in a superconducting magnet including a vacuum vessel surrounding a radiation shield and a cryogen pressure vessel suitable for magnetic resonance imaging, thermal insulation including:

a plurality of thermally insulating multi-layer blankets positioned adjacent each other within said vacuum vessel and outside said cryogen pressure vessel to assist in maintaining the cryogenic low superconducting temperatures within said superconducting magnet;

each blanket comprising a plurality of spaced layers of low thermal emissivity material separated by low conductivity spacer material secured together and adjacent edges forming a seam with joints which are offset in successive layers of said blankets; and low emissivity adhesive strips overlay the adjacent areas of a plurality of adjacent layers of adjacent blanket ends at said joints closing said secured seams to direct heat transfer to minimize heat transfer through said multi-layer blankets.

2. The superconducting magnet thermal insulation of claim 1 wherein said low emissivity material is selected from the group comprising aluminum and aluminized mylar.

3. The superconducting magnet thermal insulation of claim 2 in which said layers of said blankets are secured together by a plurality of thermally non-conductive stakes passing through the plurality of said spaced layers of low thermal emissivity material separated by low conductivity material.

4. The superconducting magnet thermal insulation of claim 3 wherein said stakes are utilized to secure said layers against relative movement and said stakes are positioned outside the region adjacent to said adjacent edges and beyond said strips.

5. The superconducting magnet thermal insulation of claim 4 wherein said stakes are T-shaped at the ends thereof and extend beyond the top and bottom of said spaced layers.

6. The superconducting magnet thermal insulation of claim 1 wherein said strips are self-adhesive and include peel-off backings substantially half of which is adhered to one of said remote ends of said blankets with the other half available for securing said remote ends together when said blankets are positioned within said vacuum vessel.

7. The superconducting magnet thermal insulation of claim 3 wherein venting slits are provided in at least some of said sheets of low emissivity material.

8. The superconducting magnet thermal insulation of claim 7 wherein said venting slits in adjacent layers are offset from each other.

9. The superconducting magnet thermal insulation of claim 8 wherein said low conductivity spacer material is spun-bonded polyester which is not bonded to the low emissivity layers.

10. A superconducting magnet vacuum vessel surrounding a radiation shield and a cryogen pressure vessel and including a thermal insulating blanket suitable for use within said vacuum vessel and for joining to similar insulating blankets, said thermal insulating blanket comprising:

a plurality of spaced layers of low emissivity reflective material separated by low conductivity layers;

a plurality of stakes extending through and securing said layers of low emissivity material and low conductivity to preclude relative motion between said layers;

a portion of a low emissivity strip overlying at least one edge of at least one of said low emissivity layers and affixed to said layer with the adjoining region of said strip extending out from said one edge; and a peel-off backing overlying a self-adhesive on said adjoining region of said strip to enable the exposing of said adhesive for securing to a similar blanket when said strip is positioned over the adjoining edge of said similar blanket;

whereby similar blankets may be joined in a thermally efficient joint at adjacent edges of refective material to provide a resultant widened blanket.

11. The superconducting magnet thermal insulation of claim 10 wherein said plurality of stakes extend through said insulating blankets in the region beyond that covered by said strip to prevent relative movement of said layers and wherein said stakes are of low thermal conductivity material.

12. The superconducting magnet of claim 11 wherein themultiple layers of each blanket are butted and said strips overly a plurality of pairs of adjoining reflective layers.

13. The superconducting magnet of claim 12 wherein one or more adjoining reflective layers include said strips applied to both sides of the joint between said layers.

14. The superconducting magnet thermal insulation of claim 13 wherein said low emissivity material is selected from the group consisting of aluminum and aluminized mylar.

* * * * *